United States Patent [19]

Hart

[11] Patent Number: 4,462,883

[45] Date of Patent: Jul. 31, 1984

[54] LOW EMISSIVITY COATINGS ON TRANSPARENT SUBSTRATES

[75] Inventor: Frederick H. Hart, St. Helens, England

[73] Assignee: Pilkington Brothers P.L.C., St. Helens, England

[21] Appl. No.: 533,796

[22] Filed: Sep. 19, 1983

[30] Foreign Application Priority Data

Sep. 21, 1982 [GB] United Kingdom ............... 8226833
Aug. 3, 1983 [GB] United Kingdom ............... 8320881

[51] Int. Cl.$^3$ ........................................... C23C 15/00
[52] U.S. Cl. ............................ 204/192 C; 204/192 R; 204/192 P; 428/621
[58] Field of Search ............... 428/621; 204/192 C, 204/192 R, 192 P

[56] References Cited

U.S. PATENT DOCUMENTS

| | | | |
|---|---|---|---|
| 3,979,271 | 9/1976 | Moreika et al. | 204/192 P |
| 4,180,448 | 12/1979 | Sashiki et al. | 204/192 C |
| 4,322,276 | 3/1982 | Meckel et al. | 204/192 R |
| 4,337,990 | 7/1982 | Fan et al. | 204/192 P |
| 4,379,040 | 4/1983 | Gillery | 204/192 P |

Primary Examiner—Arthur P. Demers
Attorney, Agent, or Firm—Burns, Doane, Swecker & Mathis

[57] ABSTRACT

A low emissivity coating on a transparent substrate of glass or plastics material is produced by cathode sputtering a layer of silver and thereafter reactively sputtering an anti-reflection metal oxide layer over the silver in the presence of oxygen or an oxidizing gas, wherein a small amount of an additional metal other than silver is sputtered onto the silver before the overlying anti-reflection metal oxide layer is applied.

The process produces a new low emissivity coated product comprising a glass or plastics substrate with a low emissivity coating comprising a silver layer, a small amount of additional metal dispersed non-uniformly in the silver layer and possibly extending over the silver layer, and an overlying anti-reflection metal oxide coating.

11 Claims, 3 Drawing Figures

LOW EMISSIVITY COATINGS ON TRANSPARENT SUBSTRATES

BACKGROUND OF THE INVENTION

1. Field of the Invention

This invention relates to low emissivity coatings on transparent substrates and, in particlar, to low emissivity silver coatings comprising a layer of silver and an overlying anti-reflective layer of metal oxide, and to the production of such coatings.

2. Description of the Prior Art

Low emissivity silver coatings are known and have been described in the prior art, for example in U.K. Patent Specification 1,307,642. This specification describes electrically conductive glass articles comprising a glass substrate and an electroconductive coating and specifies the use of an intermediate layer of not less than 50% silver 200 to 300 A thick to provide an electrical resistivity of not more than 3 ohms/square disposed between a pair of layers of non-absorbing dielectric material as anti-reflection layers, each 70 to 550 angstroms thick, to increase the light transmission of the coated glass. The specification proposes incorporating up to 10% of chromium, nickel, aluminium or titanium, or up to 50% copper, in the silver layer; use of copper is said to provide a transmission colour of grey which, according to the specification, cannot be easily obtained with a film composed substantially of silver. It is said that the deposition of silver or metal oxide may be conducted by cathodic sputtering. To form a silver layer incorporating an additional metal, either a silver alloy is evaporated or the metal elements are simultaneously evaporated under vacuum.

U.S. Pat. No. 4,166,876 describes a coating comprising a layer of metal such as silver, gold, copper, platinum or tin sandwiched between two layers of a titanium oxide on a plastics substrate. The patent teaches that, if the lower layer of titanium oxide is derived from an organic titanium compound and contains residual organic moieties, the bond to the resin substrate is markedly improved with an improvement in the transparency of the laminated structure. The specification teaches that the silver layer may contain 1 to 30% of copper which reduces the tendency of the coating to degrade, and gradually lose its light reflecting property, on prolonged exposure to light; the copper-containing silver layer may be deposited by vacuum deposition from a silver-copper alloy.

European patent specification No. 0 035 906 describes a coating comprising a layer of silver sandwiched between two layers of metal oxide. The metal oxide layers may be deposited by sputtering, ion plating, vacuum deposition or from solution. The patent teaches that a thin layer of material selected from the group consisting of titanium, zirconium, silicon, indium, carbon, cobalt and nickel should be deposited between the silver and the overlying metal oxide layer to improve the long term durability of the coating. The specification teaches that the material should be deposited under conditions such that, as far as possible, it is not converted to an oxide; and, where an overlying metal oxide layer is deposited by sputtering, the sputtering is carried out using an oxide source under an argon atmosphere thereby avoiding as far as possible oxidation of the material.

Silver coatings of the kind described above i.e. consisting of silver layers sandwiched between anti-reflection metal oxide layers not only have a high conductivity, but also exhibit a low emissivity i.e. they reflect a high proportion of infra-red radiation incident upon them whilst allowing short-wave infra-red radiation and visible radiation to pass through. The use of such coatings on window glass (or plastics used in place of glass) leads to a reduction in heat loss from the windows and, with increasing energy costs, is becoming increasingly desirable in order to reduce heating costs. Unfortunately, when attempts were made to produce a coating comprising a metal oxide layer on top of a silver layer by a reactive sputtering process in the presence of oxygen, it was found that the low emissivity properties of the silver layer were lost, and the light transmission of the product was substantially lower than expected.

SUMMARY OF THE INVENTION

It is an object of the invention to provide a process for the production of a low emissivity coating on a transparent substrate of glass or plastics material in which an anti-reflection layer of metal oxide is reactively sputtered in the presence of oxygen or an oxidising gas over a silver layer.

According to the present invention there is provided a process for the production of a low emissivity coating on a transparent substrate of glass or plastics material by cathode sputtering comprising, in sequence, (i) sputtering a layer of silver from 5 to 30 nm thick onto the transparent glass or plastics substrate (ii) sputtering an additional metal or metals other than silver in an amount equivalent to a layer 0.5 to 10 nm thick onto the silver layer and (iii) reactively sputtering, in the presence of oxygen or an oxidising gas, an anti-reflection metal oxide layer or layers over the silver and additional metal.

Thus the use of an additional metal in accordance with the invention enables an anti-reflection metal oxide layer or layers to be reactively sputtered over a silver layer under conditions which, in the absence of the additional metal, would lead to substantial loss of the low emissivity and high light transmission properties of the product. The process of the present invention permits the production, in an efficient and economical manner, of coatings having an emissivity of 0.2 or less and a light transmission of 70% or more. According to a further aspect of the invention, there is provided a silver coated glass or plastics product, coated in accordance with the present invention and having an emissivity of 0.2 or less and light transmission of at least 70%. The substrate is conveniently window glass, and the preferred products have an emissivity of 0.1 or less and a light transmission of at least 75% and preferably at least 80%.

DETAILED DESCRIPTION OF THE INVENTION

Figure 1:
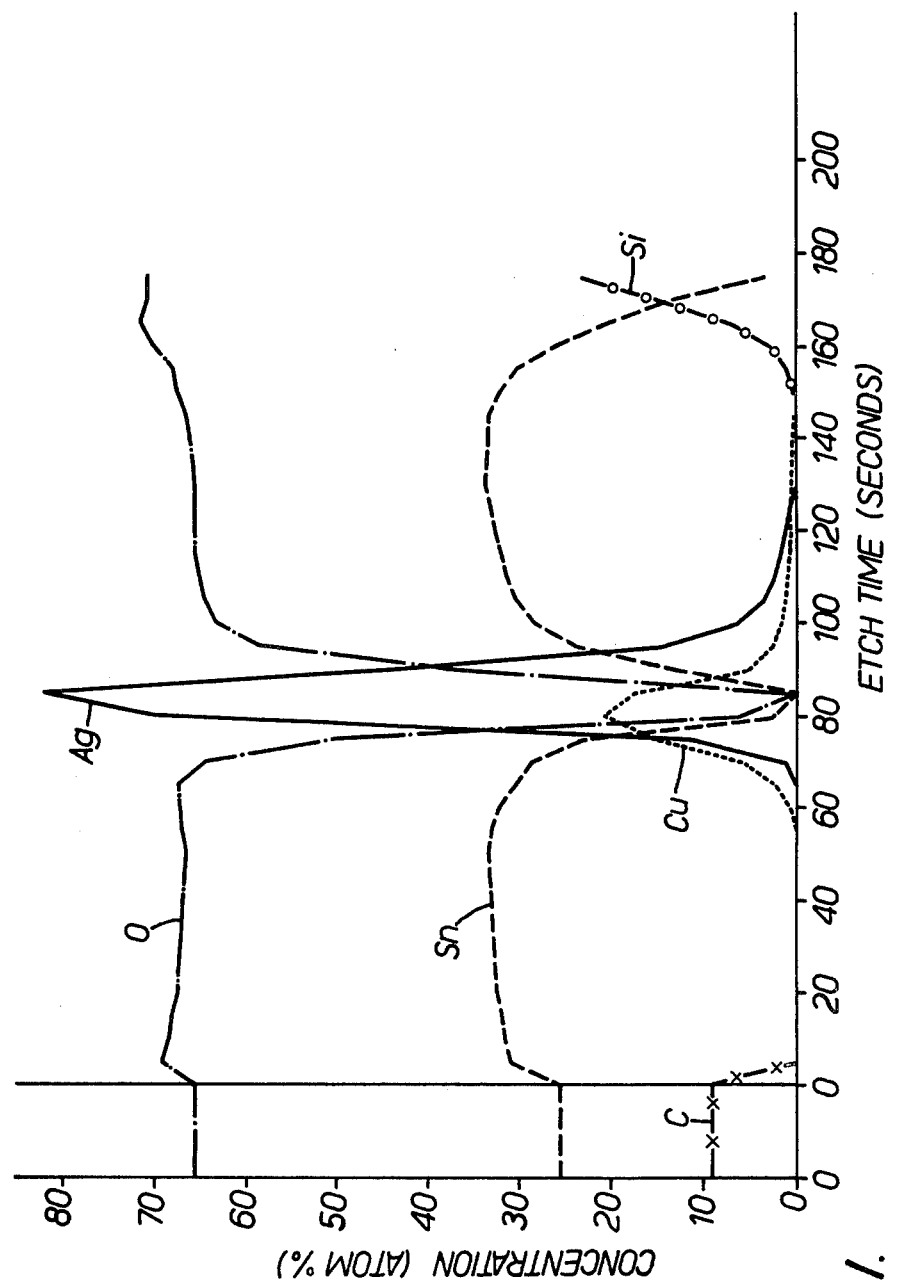
FIG. 1 shows the Auger spectra obtained on analysis of the product of Example 1.

It has been found that the sputtering of a small amount of another metal or metals after the silver substantially prevents the dramatic increase in emissivity and reduction in light transmission which otherwise occurs on subsequent deposition of an anti-reflection metal oxide layer by reactive sputtering. Moreover, once sufficient additional metal has been deposited to prevent the increase in emissivity and accompanying substantial loss in light transmission, the deposition of further such metal results in a reduction in the light transmission of the coating. It is generally desirable to maintain the light transmission of the coating as high as possible, and we therefore prefer to use just sufficient additional metal or metals to maintain the emissivity of the coating at a value of $\leqq 0.2$ whilst obtaining a coating with the maximum possible light transmission. It is believed that the precise amount of additional metal required to give the desired optimum combination of emissivity and light transmission will vary with the deposition conditions, but should be sufficient to provide a metal layer from 0.5 to 10 nm thick preferably 1 to 5 nm thick, assuming no inter-diffusion of additional metal with the underlying silver layer or overlying oxide layer. In any particular case, the optimum quantity of additional metal to be used can be determined by simple trial following the teaching of this specification.

Any additional metal must, of course, be a metal suitable for sputtering; it should have a melting point above 50° C., be stable in air and electrically conducting. The preferred metals are generally transition metals and metals of Groups 3a to 5a of the Periodic Table (as set out on page B-3 of the Handbook of Chemistry and Physics, 50th edition, published by The Chemical Rubber Co., Cleveland, Ohio), although other metals which are stable in air, melt above 50° C. and are electrically conducting may be used if desired.

Especially good results have been obtained using, as the additional metal, metals which are themselves oxidised to form metal oxides, preferably colourless metal oxides (i.e. metal oxides that do not absorb light in the visible part of the spectrum), during reactive sputtering of the overlying anti-reflection metal oxide layer, e.g. aluminium, titanium and zirconium. When using metals which become oxidised to colourless metal oxides, increasing the amount of the metal used has less effect on the light transmission of the product than when using coloured metals, e.g. copper and gold, which are not so readily oxidised. The tendency of a metal to form an oxide depends on the free energy of formation of the metal oxide. Apart from the surprisingly good results obtained with copper, which is not readily oxidised, the best results have been obtained using metals whose oxides have a standard free energy of formation more negative than $-100,000$ cal/gram mole of oxygen at 0° C. (for values of standard free energies of oxide formation, see, for example, FIG. 3.3 in "Thermochemistry for Steelmaking", Volume 1, 1960 by John F. Elliott and Molly Gleiser, published by Addison-Wesley Publishing Company Inc). However, even with metals such as titanium, which become oxidised to colourless metal oxides, it is generally preferred to use an amount of metal sufficient to provide a metal layer less than 5 nm thick (assuming no oxidation and no inter-diffusion of the metal with the silver layer and the overlying anti-reflection metal oxide layer) in order to maximise the light transmission of the product.

Other examples of preferred metals include bismuth, indium, lead, manganese, iron, chromium, nickel, cobalt, molybdenum, tungsten, platinum, gold, vanadium and tantalum, and alloys of these metals, e.g. stainless (Fe/Cr/Ni) and brass (Cu/Zn).

Sufficient silver is deposited to provide a layer from 5 to 30 nm thick. In general, the thicker the silver layer, the lower the emissivity but the lower the total light transmission. Thicknesses greater than 20 nm are generally only required for electroconductive applications and, for low emissivity coatings, we generally use a silver layer less than 20 nm thick, preferably from 8 to 15 nm thick.

The anti-reflection metal oxide layer over the silver layer is preferably comprised of a metal oxide with low visible light absorption and may be, for example, of tin oxide, titanium oxide, zinc oxide, indium oxide (optionally doped with tin oxide) bismuth oxide or zirconium oxide. Tin oxide, titanium oxide and indium oxide (optionally doped with tin oxide), bismuth oxide and zirconium oxide are preferred because, in addition to the anti-reflection properties they provide, they also have good durability and serve to provide the silver layer with some protection from mechanical damage. The thickness of the anti-reflection layer used will depend on the particular metal oxide used and the colour of the product desired, but will usually be in the range 10 to 80 nm, especially 20 to 60 nm. If desired, instead of using a single metal oxide layer, a succession of two or more layers of different metal oxides of similar total thickness, i.e. usually 10 to 80 nm, especially 20 to 60 nm, may be used.

If desired, an anti-reflection layer may be sputtered onto the glass before the silver layer to increase the light transmission of the product. When an anti-reflection layer is deposited under the silver layer, it may conveniently be a metal oxide layer e.g. any of the metal oxides described above for use as an anti-reflection layer over the silver layer. This underlayer may serve, not only as an anti-reflection layer, but also as a primer layer to improve the adhesion of the silver layer to the glass. It will usually have a thickness in the range 10 nm to 80 nm, especially 20 nm to 60 nm, although, in any particular case, the thickness used will depend on the metal oxide chosen and the colour and other properties desired in the product. If desired, a succession of two or more anti-reflection layers of similar total thickness, i.e. usually 10 to 80nm, especially 20 to 60 nm, may be used under the silver layer.

In a preferred embodiment, the invention resides in a process for the production of a low emissivity coating on a transparent substrate of glass by cathode sputtering comprising (a) depositing an anti-reflection layer of $SnO_2$ 30 to 50 nm thick on the glass substrate by reactive sputtering of tin in the presence of oxygen or an oxidising gas;

(b) sputtering a layer of silver 8 to 12 nm thick onto said anti-reflection layer;

(c) sputtering copper in an amount equivalent to a layer of copper 1 to 5 nm thick onto said silver layer;

and thereafter (d) depositing on the coating so formed an anti-reflection layer of $SnO_2$ 30 to 50 nm thick by reactive sputtering of tin in the presence of oxygen or an oxidising gas.

The manner in which the additional metal deposited after the silver serves to prevent degradation of the coating properties is not understood; one possibility is that it has the effect of preventing oxidation of the silver on reactive sputtering of an overlying anti-reflection metal oxide layer; alternatively, it may be that, under the oxidising conditions used for deposition of the metal oxide layer, the silver tends to agglomerate so that the silver layer becomes discontinuous and the presence of additional metal at the surface of the silver layer inhibits this tendency. However, it does not appear necessary to take any corresponding steps to prevent attack on the silver by oxygen in any underlying anti-reflection metal oxide layer.

For high throughput, sputtering processes may be magnetically enhanced, and the process of the present invention is especially useful in processes in which the metal and metal oxide layers are deposited by magnetically enhanced sputtering. In such magnetically enhanced sputtering, conditions are generally more stringent and more likely to lead to deterioration of the silver layer than in non-enhanced sputtering processes.

Examination of coatings produced by the process of the invention by Auger electron spectroscopy has shown that the additional metal, rather than being deposited on top of the silver layer as a separate layer, may be dispersed through the silver layer, though it is concentrated in the upper part of the silver layer and may extend over its upper surface. In some cases it may be associated with additional oxygen i.e. it may be present, at least in part, as a metal oxide.

Thus, according to a further aspect of the invention, there is provided a glass or plastics substrate coated with a low emissivity coating comprising (a) a silver layer 5 to 30 nm thick (b) an additional metal or metals in a total amount equivalent to a metal layer from 0.5 to 10 nm thick, said additional metal or metals being dispersed non-uniformly in the silver layer so that the concentration of additional metal or metals in the silver is at a maximum in the upper half of the silver layer and (c) an overlying anti-reflection metal oxide layer.

In a preferred embodiment, a glass substrate with a low emissivity coating comprises in order, (a) an anti-reflection layer of $SnO_2$ 30 to 50 nm thick (b) a layer of silver 8 to 12 nm thick (c) sufficient copper to provide a copper layer 1 to 5 nm thick, said copper being dispersed in the silver layer so that the concentration of copper in the silver is at a maximum in the upper half of the silver layer and (d) an anti-reflection layer of $SnO_2$ 30 to 50 nm thick.

In products having especially good properties of emissivity and light transmission, it is found that the additional metal or metals are not wholly dispersed in the silver layers but extend over the upper surface of the silver layers. In some cases, the additional metal or metals are present, at least in part, as metal oxides.

In the present specification and claims, the values quoted for light transmission are for transmission of light from a C.I.E. Illuminant C Source. The values of emissivity quoted are those obtained by applying the formula $$\text{Emissivity}, \epsilon = \frac{\int_0^\infty e_\lambda B(\lambda, T) d\lambda}{\int_0^\infty B(\lambda, T) d\lambda}$$

where $e_\lambda$ = spectral emittance
and $B(\lambda, T)$ = black body spectral energy distribution at 300° K.

The invention is illustrated but not limited by the following examples:

EXAMPLE 1

A pane of float glass 4 mm thick was prepared for coating by washing and drying, and loaded onto an in-line D.C. planar magnetron sputtering apparatus.

Tin oxide ($SnO_2$) was reactively sputtered on to the glass surface from a tin cathode in the presence of an oxygen atmosphere at $2.5 \times 10^{-3}$ torr to give a tin oxide layer 40 nm thick. A layer of silver 10 nm thick was then sputtered onto the tin oxide from a silver cathode in the presence of an argon atmosphere at $3 \times 10^{-3}$ torr. A further layer of tin oxide 40 nm thick was reactively sputtered on to the silver layer from a tin cathode in the presence of oxygen atmosphere at $2.5 \times 10^{-3}$ torr. The product was found to have a light transmission of 55% and an emissivity of 0.9.

The procedure described above was repeated, except that, in accordance with the invention, immediately after sputtering the silver layer, copper was sputtered onto the silver from a copper cathode in the presence of argon at $3 \times 10^{-3}$ torr, in an amount equivalent to a layer of copper 1.6 nm thick. The second layer of tin oxide was then reactively sputtered immediately after the copper from a tin cathode in the presence of an oxygen atmosphere at $2.5 \times 10^{-3}$ torr for the same time and under the same conditions as in the experiment described above. In this case, the light transmission of the product was found to be 79%. The emissivity of the coated product was found to be 0.06. The effect of the copper in providing a low emissivity product with a high light transmission is apparent.

The product incorporating the copper was analysed by Auger electron spectroscopy, and the results are shown in FIG. 1. In Auger analysis, a beam of electrons (the primary beam) is directed onto the surface to be analysed, and the elements present in the surface are characterised and quantified by examining the energy spectrum of secondary electrons emitted from the surface. The surface atomic layers are then removed by argon ion etching to expose sub-surface atoms which are then characterised and quantified as described above. The etching and analysis steps are repeated to build up a profile of the composition of the surface layers to the required depth (in this case the thickness of the coating). The sputtering or ion etch time, which is plotted along the x-axis shown in FIG. 1, is an approximate measure of the depth from the surface of the coating but, as different materials are removed at different rates, it is not linearly related to coating depth. The concentration of material removed, in atomic percent, is plotted on the y-axis.

It will be seen that, at the surface of the coating (i.e. when removal by etching begins) the composition of the coating corresponds substantially to $SnO_2$. The spectrum shows a substantial peak in the middle representing the silver layer with a much lower peak, within the silver peak, representing the copper dispersed in the silver layer. It will also be observed that the maximum concentration of copper, of approximately 20 atomic percent, occurs after a time of 80 seconds and is within the upper half of the silver layer. Moreover, a small proportion of copper apparently lies over the silver layer i.e. copper is detected after a time of 55 seconds whilst silver is not detected until after a time of 65 seconds. It is believed that the presence of a small amount of copper over the silver layer is desirable and leads to improved properties. After about 95 seconds, the material removed is predominantly SnO$_2$. After about 150 seconds, some silicon is detected, presumably derived from the glass surface.

It will be observed that there is a significant overlap of the different materials applied in the process. It is believed that this results from diffusion of ions in the coating but, as the sample was prepared on an in-line sputtering apparatus with adjacent cathodes operating simultaneously, some overlap may have occurred on deposition.

EXAMPLE 2

The procedure described above, including the deposition of copper, was repeated using the same sputtering time and condition as above, but varying the amount of copper deposited. When copper was sputtered in an amount equivalent to a layer of copper 3.2 nm thick, the final product had a light transmission of 75% and an emissivity of 0.16. When the copper was sputtered in an amount equivalent to a layer of copper 1.0 nm thick, the product was found to have a light transmission of 79% and an emissivity of 0.12.

EXAMPLE 3

A pane of float glass 4 mm thick was prepared for coating by washing and drying, and loaded onto an in-line D.C. planar magnetron sputtering apparatus.

Tin oxide was reactively sputtered on to the glass surface from a tin cathode in the presence of an oxygen atmosphere at $2.5 \times 10^{-3}$ torr to give a tin oxide layer 30 nm thick. Zinc oxide was then reactively sputtered onto the tin oxide in the presence of an oxygen atmosphere at $2.5 \times 10^{-3}$ torr to give a zinc oxide layer 15 nm thick. A layer of silver 10 nm thick was then sputtered onto the zinc oxide from a sliver cathode in the presence of an argon atmosphere at $3 \times 10^{-3}$ torr and copper was sputtered onto the silver from a copper cathode in the presence of argon at $2.5 \times 10^{-3}$ torr and in an amount equivalent to a layer of copper 3.2 nm thick. Finally, layers of zinc oxide and tin oxide, 15 nm thick and 30 nm thick respectively, were reactively sputtered in that order over the copper from metal cathodes in the presence of oxygen atmospheres at $2.5 \times 10^{-3}$ torr. The resulting coated product was found to have an emissivity of 0.08 and a light transmission of 80%.

EXAMPLE 4

A pane of float glass 4 mm thick was prepared for coating by washing and drying, and loaded onto an in-line D.C. planar magnetron sputtering apparatus.

Tin and indium were reactively sputtered on to the glass surface from a cathode comprising 90% weight indium 10% weight tin in the presence of an oxygen atmosphere at $2.5 \times 10^{-3}$ torr to give a tin doped indium oxide layer 30 nm thick. A layer of silver 10 nm thick was then sputtered onto the tin oxide from a silver cathode in the presence of an argon atmosphere at $3 \times 10^{-3}$ torr, and copper was sputtered onto the silver from a copper cathode in the presence of argon at $3.0 \times 10^{-3}$ torr and in an amount equivalent to a layer of copper 3.2 nm thick. Finally, a second anti-reflection layer of tin doped indium oxide 30 nm thick, similar to the first layer, was reactively sputtered over the copper. The resulting coated product was found to have an emissivity of 0.1 and a light transmission of 74%.

EXAMPLE 5

A pane of float glass 4 mm thick was prepared for coating by washing and drying, and loaded onto an in-line D.C. planar magnetron sputtering apparatus.

Tin oxide was reactively sputtered on to the glass surface from a tin cathode in the presence of an oxygen atmosphere at $2.5 \times 10^{-3}$ torr to give a tin oxide layer 40 nm thick. Titanium oxide was then reactively sputtered onto the tin oxide in the presence of an oxygen atmosphere at $2.5 \times 10^{-3}$ torr to give a titanium oxide layer 10 nm thick. A layer of silver 10 nm thick was then sputtered onto the titanium oxide from a silver cathode in the presence of an argon atmosphere at $3 \times 10^{-3}$ torr, and copper was sputtered onto the silver from a copper cathode in the presence of argon at $3 \times 10^{-3}$ torr and in an amount equivalent to a layer of copper 3.2 nm thick. Finally, layers of titanium oxide and tin oxide, 10 nm thick and 40 nm thick respectively, were reactively sputtered in that order over the copper from metal cathodes in the presence of oxygen atmospheres at $2.5 \times 10^{-3}$ torr. The resulting coated product was found to have an emissivity of 0.15 and a light transmission of 80%.

EXAMPLE 6

A pane of float glass 4 mm thick was prepared for coating by washing and drying, and loaded onto an in-line D.C. planar magnetron sputtering apparatus.

Titanium oxide was reactively sputtered on to the glass surface from a titanium cathode in the presence of an oxygen atmosphere at $2.5 \times 10^{-3}$ torr to give a titanium oxide layer 15 nm thick. Tin oxide was then reactively sputtered onto the titanium oxide in the presence of an oxygen atmosphere at $2.5 \times 10^{-3}$ torr to give a tin oxide layer 40 nm thick. A layer of silver 10 nm thick was then sputtered onto the tin oxide from a silver cathode in the presence of an argon atmosphere at $3 \times 10^{-3}$ torr, and tin was sputtered onto the silver from a tin cathode in the presence of argon at $3 \times 10^{-3}$ torr and in an amount equivalent to a layer of tin 3.5 nm thick. Finally, layers of tin oxide and titanium oxide, 40 nm thick and 15 nm thick respectively, were reactively sputtered in that order over the tin from metal cathodes in the presence of oxygen atmospheres at $2.5 \times 10^{-3}$ torr. The resulting coated product was found to have an emissivity of 0.16 and a light transmission of 76%.

EXAMPLES 7–22

A pane of float glass 4 mm thick was prepared for coating by washing and drying, and loaded onto an in-line D.C. planar magnetron sputtering apparatus.

Tin oxide was reactively sputtered on to the glass surface from a tin cathode in the presence of a 20% argon/80% oxygen atmosphere at a pressure of $6 \times 10^{-3}$ torr to give a tin oxide layer 40 nm thick. A layer of silver 10 nm thick was then sputtered on to the tin oxide from a silver cathode in the presence of an argon atmosphere at $6 \times 10^{-3}$ torr, and stainless stell in an amount equivalent to a layer 3.5 nm thick was sputtered on to the silver from a cathode of 316 stainless steel (an alloy of chromium, nickel and iron) in an argon atmosphere at $6 \times 10^{-3}$ torr. Finally a layer of tin oxide was reactively sputtered on to the glass surface from a tin cathode in the presence of a 20% argon/80% oxygen atmosphere at a pressure of $6 \times 10^{-3}$ torr to give a tin oxide layer 40 nm thick. The resulting coated product was found to have an emissivity of 0.15 and a light transmission of 80%.

The procedure was repeated using the same conditions but with different metal cathodes in place of the stainless steel cathode. In each case, it was found that the use of the additional metal resulted in the product maintaining its low emissivity and high light transmission. The results are set out in the Table below.

| Example | Initial Anti-Reflection Metal | Initial Anti-Reflection Oxide | Thickness of Silver | Thickness of Additional Metal | Thickness of Additional Metal | Anti-Reflection Metal | Anti-Reflection Oxide | Emissivity | Light Transmission |
|---|---|---|---|---|---|---|---|---|---|
| 7 | SnO$_2$ | 40 nm | 10 nm | Fe/Cr/Ni | 3.5 nm | SnO$_2$ | 40 nm | 0.15 | 80% |
| 8 | SnO$_2$ | 40 nm | 10 nm | Ti | 3.5 nm | SnO$_2$ | 40 nm | 0.15 | 82% |
| 9 | SnO$_2$ | 40 nm | 10 nm | brass* | 3.5 nm | SnO$_2$ | 40 nm | 0.15 | 81% |
| 10 | SnO$_2$ | 40 nm | 10 nm | Al | 3.5 nm | SnO$_2$ | 40 nm | 0.11 | 82% |
| 11 | SnO$_2$ | 40 nm | 10 nm | Cu | 3.5 nm | SnO$_2$ | 40 nm | 0.08 | 81% |
| 12 | SnO$_2$ | 56 nm | 15 nm | Ti | 3.0 nm | SnO$_2$ | 56 nm | 0.10 | 84% |
| 13 | SnO$_2$ | 48 nm | 10 nm | Ti | 4.9 nm | SnO$_2$ | 42 nm | 0.17 | 80% |
| 14 | SnO$_2$ | 48 nm | 10 nm | Ti | 6.2 nm | SnO$_2$ | 42 nm | 0.21 | 75% |
| 15 | SnO$_2$ | 48 nm | 10 nm | Ti | 8.6 nm | SnO$_2$ | 42 nm | 0.24 | 62% |
| 16 | SnO$_2$ | 47 nm | 8 nm | brass* | 2.1 nm | SnO$_2$ | 42 nm | 0.13 | 83% |
| 17 | SnO$_2$ | 47 nm | 10 nm | In/Sn** | 1.7 nm | SnO$_2$ | 42 nm | 0.44 | 67% |
| 18 | SnO$_2$ | 48 nm | 10 nm | Ni | 3.8 nm | SnO$_2$ | 42 nm | 0.17 | 79% |
| 19 | SnO$_2$ | 48 nm | 10 nm | Zr | 2.7 nm | SnO$_2$ | 43 nm | 0.13 | 84% |
| 20 | SnO$_2$ | 48 nm | 10 nm | Mo | 3.0 nm | SnO$_2$ | 42 nm | 0.17 | 71% |
| 21 | SnO$_2$ | 48 nm | 12 nm | Pb | 6.4 nm | SnO$_2$ | 42 nm | 0.14 | 78% |
| 22 | SnO$_2$ | 46 nm | 10 nm | Au | 7.9 nm | SnO$_2$ | 42 nm | 0.19 | 76% |
| Comparative example | SnO$_2$ | 48 nm | 10 nm | — | — | SnO$_2$ | 42 nm | 0.88 | 61% |

*65% copper, 35% zinc.
**90% indium, 10% tin.

Figure 2:
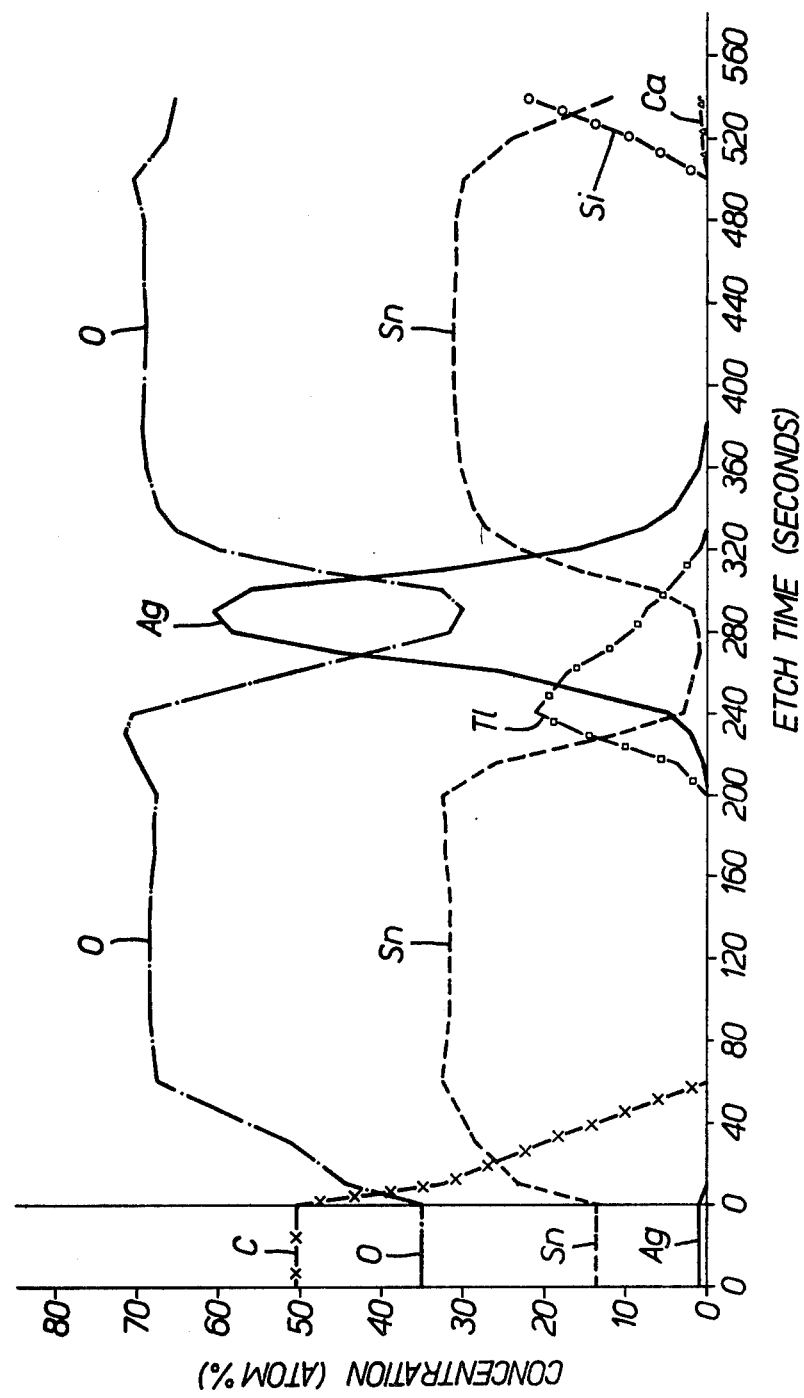
FIG. 2 shows the Auger spectra obtained on analysis of the product of Example 8.
Figure 3:
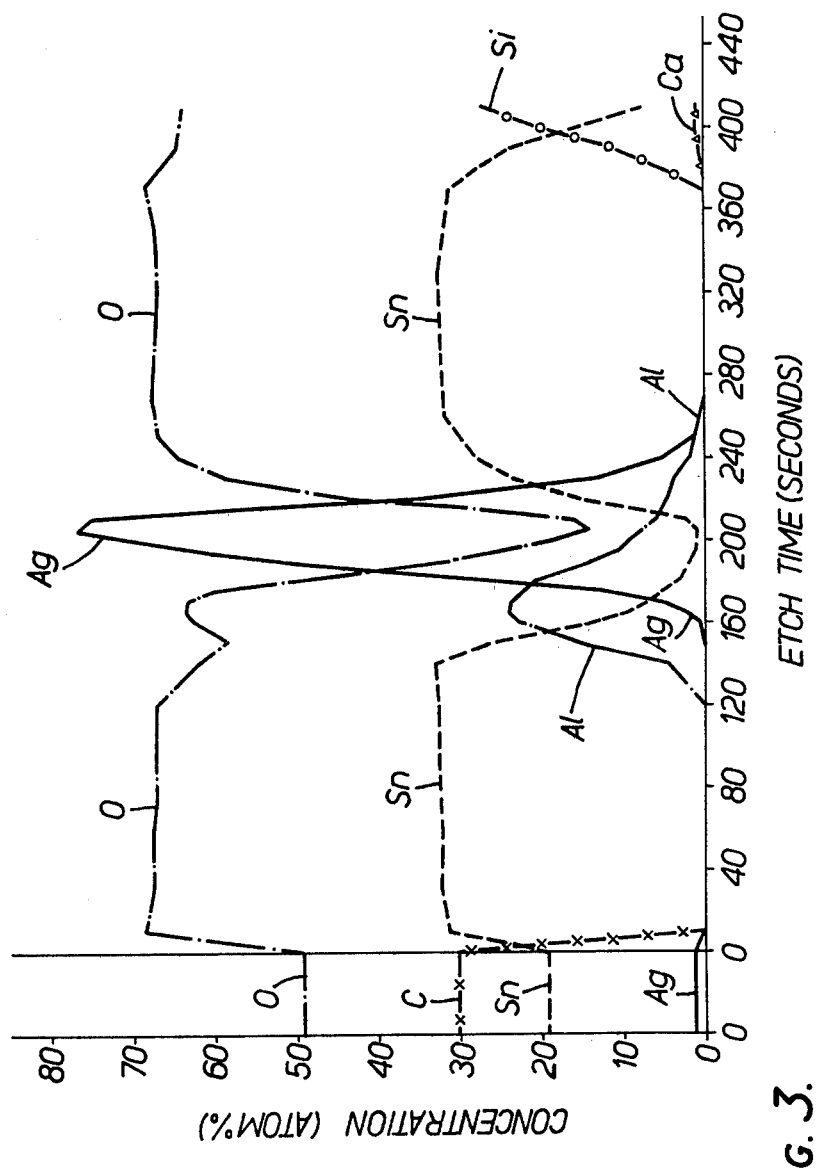
FIG. 3 shows the Auger spectra obtained on analysis of the product of Example 10.

FIGS. 2 and 3 show the Auger spectra obtained on analysis of products of Examples 8 and 10 respectively. They were obtained in a similar manner to the spectrum illustrated in FIG. 1, but using slower etches to remove the coatings.

Referring to FIG. 2 it was seen that, at the surface of the coating, the composition corresponds substantially to SnO$_2$. The spectrum shows a substantial silver peak in the middle with a much lower peak, representing the titanium, to the left of the silver peak. However, it should be noted that titanium and silver are both detected after the same etch or sputter time of 200 seconds, although the titanium peak rises more rapidly than the silver peak suggesting a mixture of silver, titanium and tin which is initially richer in titanium than silver but, after an etch time of just over 250 seconds, becomes richer in silver than titanium. The titanium is thus dispersed non-uniformly in the silver with the maximum concentration of titanium in the silver being in the upper part of the silver layer. It will also be noted that the oxygen concentration never falls below about 30%, suggesting that the titanium is present as titanium oxide (probably titanium dioxide). After about 320 seconds, nearly all the titanium has been removed and the composition of the coating is pre-dominantly tin oxide although a significant proportion (about 20 atomic percent) of silver remains. As etching continues the silver concentration falls to zero at about 380 seconds; the remainder of the coating correspond substantially to SnO$_2$ until elements from the glass surface are detected after an etch time of nearly 500 seconds.

FIG. 3 is similar to FIG. 2, but in this case additional metal (aluminium) is detected, at an etch time of 120 seconds, before the silver metal. Silver is first detected after an etch time of 150 seconds, shortly before the peak aluminium concentration is reached. Both silver and aluminium are detected up to an etch time of 270 seconds although after about 230 seconds the coating consists predominantly of tin oxide. The oxygen concentration shows a small peak corresponding to the peak of aluminium concentration and falls to a minimum of about 15% in the middle of the silver layer; this suggests that the aluminium is present, at least in part, as aluminium oxide.

The Auger spectrum obtained on analysis of the product of Example 7 was similar to those described above, in that it showed on oxygen peak corresponding to the peak concentration of additional metal. This indicates that substantial oxidation of the stainless steel had taken place (the peak iron concentration was observed at an etch time of 170 seconds; at the peak iron concentration, the concentration of the coating was determined as 15 atomic percent iron, 7 atomic percent tin, 3 atomic percent silver, 2 atomic percent nickel and 73 atomic percent nickel).

Examples 12 to 15 show the effect of increasing the amount of titanium used as the additional metal. It will be noted that, when the amount of titanium used is greater than that equivalent to a titanium layer 5 nm thick, the light transmission of the product falls below 80%. Similarly, the other metals used generally gave the best results when used in amounts equivalent to a metal layer less than 5 nm thick. Lead and gold were exceptions, and appeared most effective when used in amounts equivalent to a metal layer of about 6 to 8 nm thick.

In the present specification and claims, the amount of additional metal used is defined in terms of equivalent layer thickness, that is, the thickness of the additional layer that would be formed by sputtering the same amount of the additional metal assuming the additional metal was not oxidised and there was no inter-diffusion between the additional metal and the adjacent silver and anti-reflection metal oxide layers.

I claim:

1. A process for the production of a low emissivity coating on a transparent substrate of glass or plastics material by cathode sputtering comprising, in sequence,
   (i) sputtering a layer of silver from 5 to 30 nm thick onto the transparent glass or plastics substrate (ii) sputtering at least one additional metal other than silver in amount equivalent to a layer 0.5 to 10 nm thick onto the silver and (iii) reactively sputtering, in the presence of oxygen or an oxidising gas, at least one anti-reflection metal oxide layer over the silver and additional metal.

2. A process according to claim 1 wherein the or each additional metal is a metal which forms a colourless metal oxide on subsequent reactive sputtering of the anti-reflection metal oxide.

3. A process according to claim 1 wherein the additional metal is copper.

4. A process according to claim 1 wherein additional metal is sputtered onto the silver in a total amount equivalent to a layer 1 to 5 nm thick.

5. A process according to claim 1 wherein the layer of silver sputtered is 8 to 15 nm thick.

6. A process according to claim 1 wherein an anti-reflection layer is sputtered onto the substrate before sputtering of the silver layer.

7. A process according to claim 1 for the production of a low emissivity coating on a transparent substrate of glass by cathode sputtering comprising (a) depositing an anti-reflection layer of $SnO_2$ 30 to 50 nm thick onto the glass substrate by reactive sputtering of tin in the presence of oxygen or an oxidising gas;

(b) sputtering a layer of silver 8 to 12 nm thick onto said anti-reflection layer;

(c) sputtering copper in an amount equivalent to a layer of copper 1 to 5 nm thick onto said silver layer;

and thereafter (d) depositing on the coating so formed an anti-reflection layer of $SnO_2$ 30 to 50 nm thick by reactive sputtering of tin in the presence of oxygen or an oxidising gas.

8. A process according to claim 1 wherein the sputtering processes are aided by magnetic enhancement.

9. A process according to claim 1 for the production of a low emissivity coating on a transparent glass substrate by D.C. magnetron sputtering comprising, in sequence, (i) sputtering an anti-reflection metal oxide layer on to the substrate;

(ii) sputtering a layer of silver from 8 to 15 nm thick onto the said layer;

(iii) sputtering an additional metal or metals other than silver in an amount equivalent to a layer 0.5 to 5 nm thick onto the silver; and (iv) reactively sputtering, in the presence of oxygen or an oxidising gas, an anti-reflection metal oxide layer or layers over the silver and additional metal.

10. A process according to claim 9 wherein the additional metal is copper.

11. A process according to claim 9 wherein the additional metal is a metal which forms a colourless metal oxide on subsequent reactive sputtering of the anti-reflection metal oxide layer.

* * * * *